US006627929B2

United States Patent
Shim et al.

(10) Patent No.: US 6,627,929 B2
(45) Date of Patent: Sep. 30, 2003

(54) SOLID STATE CCD IMAGE SENSOR HAVING A LIGHT SHIELDING LAYER

(75) Inventors: Jin Seop Shim, Cheongju-si (KR); Seo Kyu Lee, Cheongju-si (KR)

(73) Assignee: LG Semicon Co., Ltd., Chungcheongbuk Do (KR)

( * ) Notice: Subject to any disclaimer, the term of this patent is extended or adjusted under 35 U.S.C. 154(b) by 0 days.

(21) Appl. No.: 09/879,061

(22) Filed: Jun. 13, 2001

(65) Prior Publication Data

US 2001/0028073 A1 Oct. 11, 2001

Related U.S. Application Data

(62) Division of application No. 09/170,101, filed on Oct. 13, 1998, now Pat. No. 6,300,157.

(30) Foreign Application Priority Data

Feb. 16, 1998 (KR) .......................................... 1998/4629

(51) Int. Cl.[7] .............................................. H01L 31/062
(52) U.S. Cl. ...................... 257/292; 257/293; 257/294; 257/435; 257/462; 257/465
(58) Field of Search .................................. 257/292–294, 257/435, 462, 465

(56) References Cited

U.S. PATENT DOCUMENTS

| | | | |
|---|---|---|---|
| 4,046,609 A | 9/1977 | Digoy | 438/57 |
| 5,338,691 A | 8/1994 | Enomoto et al. | 438/57 |
| 5,403,384 A | 4/1995 | Faul et al. | 95/96 |
| 5,510,285 A * | 4/1996 | Kim | 437/53 |
| 5,618,384 A | 4/1997 | Chan et al. | 438/669 |
| 6,166,372 A * | 12/2000 | Yamamoto et al. | 250/225 |

FOREIGN PATENT DOCUMENTS

JP   2000-59688 A  *  2/2000  ......... H01L/27/146

* cited by examiner

Primary Examiner—Allan R. Wilson
Assistant Examiner—Matthew E. Warren
(74) Attorney, Agent, or Firm—Morgan, Lewis & Bockius LLP

(57) ABSTRACT

Provided with a solid state image sensor, which is adapted to simplify the process with enhancement of the morphology of the device and has photo-diodes formed on a semiconductor substrate, and transfer gates disposed around the photo-diodes to transfer signal charges generated from the photo-diodes, the solid state image sensor including: an insulating layer forming on the whole surface of the semiconductor substrate and having a contact hole exposing a defined portion of the transfer gates; a metal line formed to include the inside of the contact hole; and a light-shielding layer formed in the same layer with the metal line without overlapping the upper parts of the photo-diodes.

6 Claims, 10 Drawing Sheets

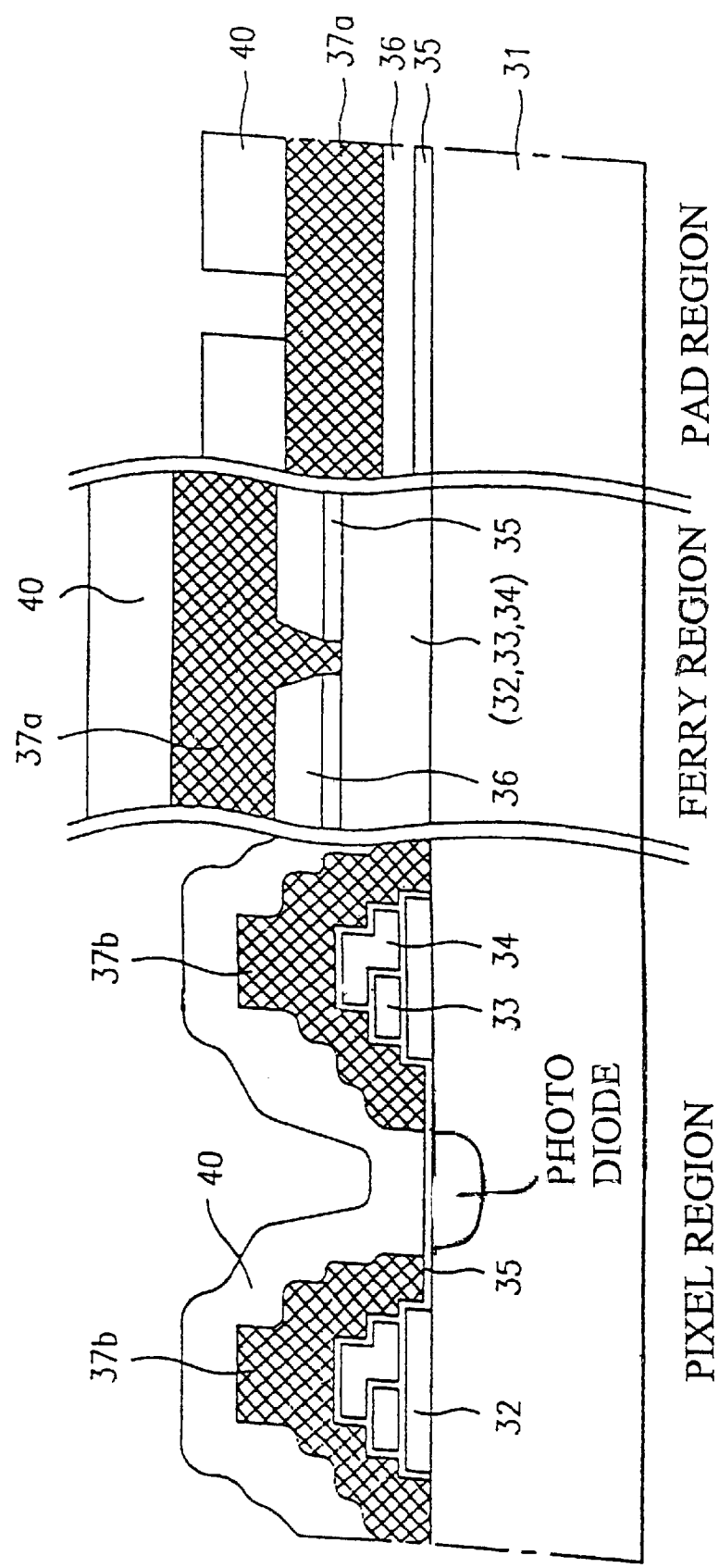

SOLID STATE CCD IMAGE SENSOR HAVING A LIGHT SHIELDING LAYER

This is a divisional of application(s) application Ser. No. 09/170,101 filed on Oct. 13, 1998 now U.S. Pat. No. 6,300,157.

BACKGROUND OF THE INVENTION

1. Field of the Invention

The present invention relates to a solid state image sensor and, more particularly, to a solid state image sensor and a method for fabricating the same which is adapted to simplify the process and enhance the morphology of the sensor.

2. Discussion of Related Art

With reference to the attached drawings, a conventional solid state image sensor and its fabricating method will be described below with respect to a method of forming a metal line between PDs (Photo-Diodes).

FIG. 1 is a cross-sectional view of a solid state image sensor fabricated according to prior art and FIGS. 2a–2e are cross-sectional views illustrating a method of fabricating the conventional solid state image sensor, wherein there are shown a pixel region, a contact forming region in a ferry region, and a pad forming region in the order from the left side of the figures.

Such a solid state image sensor, as shown in FIG. 1, has first, second and third transfer gates 12, 13 and 14 between the PDs of the pixel region and in the contact forming region of the ferry region.

An HLD (High-temperature and Low-pressure Dielectric) layer 15 is provided to surround the first, second and third transfer gates 12, 13 and 14. There are further formed a second aluminum film 21 approximately 4000 Å thick as a light-shielding layer in the region exclusive of the photo-diodes, and a passivation layer 23 on the whole surface in the pixel region.

A contact hole is disposed between the HLD layer 15 and a smooth protective layer 16, exposing defined regions of the first, second and third transfer gates 12, 13 and 14 in the contact forming region. Further, a first aluminum film 17 is formed on the contact hole and smooth protective layer 16 and an insulating layer 19 consisting of PSiO is formed on the first aluminum film 17. On the insulating layer 19 is disposed a passivation layer 23.

On substrate 11 in the pad forming region are sequentially laminated HLD layer 15, smooth protective layer 16 and first aluminum film 17. The insulating layer 19 and passivation layer 23 are pad-open such that a defined portion of the first aluminum layer 17 is exposed.

FIGS. 2a–2e are cross-sectional views illustrating a method for fabricating such a conventional solid state image sensor.

As shown in FIG. 2a, a substrate 11 has first, second and third transfer gates 12, 13 and 14 laminated between PDs (Photo-Diodes) and in the ferry region, and an HLD layer 15 surrounding the first, second and third transfer gates 12, 13 and 14. A nitride layer is deposited on the substrate 11 and a part of the nitride layer disposed in the ferry region is then eliminated. After deposition of a smooth protective layer 16 on the substrate 11, a photo resist is deposited on the whole surface. Part of the photo resist in the contact forming region is then selectively patterned through an exposure and a development. Using the photo resist patterned as a mask, the smooth protective layer 16 and HLD layer 16 in the contact forming region are eliminated, exposing defined portions of the first, second and third transfer gates 12, 13 and 14. A first aluminum film 17 is deposited on the whole surface by a sputtering technique. Subsequently, a photo resist 18 is formed on the whole surface of the substrate 11 and selectively patterned through an exposure and a development to eliminate only the pixel region.

As shown in FIG. 2b, the photo resist 18 patterned is used as a mask in eliminating the first aluminum film 17 in the pixel region. An insulating layer 19 consisting of PSiO is deposited on the smooth protective layer 16 in the pixel region and on the first aluminum film 17 in the contact forming region and in the pad region.

As shown in FIG. 2c, a photo resist 20 is formed on the whole surface and selectively patterned through an exposure and a development such that only the photo resist 20 in the pixel region is eliminated. The photo resist 20 selectively patterned is used as a mask to eliminate the insulating layer 19 and smooth protective layer 16.

As shown in FIG. 2d, following removal of the photo resist 20, a second aluminum film 21 is formed on the whole surface of the substrate 11 by the sputtering technique. A photo resist 22 is formed on the second aluminum film 21 and selectively patterned through an exposure and a development, etching the upper portion of the photo-diode in the pixel region and the photo resist 22 in the ferry region.

As shown in FIG. 2e, the photo resist 22 patterned is used as a mask in performing an anisotropic etching of the upper portion of the photo-diode in the pixel region and the second aluminum film 21 in the ferry region. On the whole surface of the substrate 11 is deposited a passivation layer 23 consisting of PSiN. Next, the passivation layer 23 in the pas forming region and the insulating layer 19 consisting of PSiO are anisotropically etched to expose the first aluminum film 17.

However, such a solid state image sensor and method for fabricating the same involves a problem that the entire number of processes is increased with a consequence of reduction in the productivity because two time of deposition of the aluminum film is required in forming the light-shielding layer in the pixel region and the metal line in the contact forming region and the pad forming region of the ferry region.

SUMMARY OF THE INVENTION

Accordingly, the present invention is directed to a solid state image sensor and method for fabricating the same that substantially obviates one or more of the problems due to limitations and disadvantages of the related art.

An object of the present invention is to provide a solid state image sensor and method for fabricating the same which is adapted to simplify the process and enhance the productivity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a solid state image sensor, which has photo-diodes formed on a semiconductor substrate, and transfer gates disposed around the photo-diodes to transfer signal charges generated from the photo-diodes, includes: an insulating layer forming on the whole surface of the semiconductor substrate and having a contact hole exposing a defined portion of the transfer gates; a metal line formed to include the inside of the contact hole; and a light-shielding layer formed in the same layer with the metal line without overlapping the upper parts of the photo-diodes.

In another aspect of the present invention, a method for fabricating a solid state image sensor includes the steps of: forming an insulating layer on the whole surface of a semiconductor substrate having photo-diodes and transfer gates formed around the photo-diodes; selectively etching the insulating layer to form a contact hole exposing a defined portion of the transfer gates; forming a metal line on the whole surface of the substrate including the inside of the contact hole; first etching the metal line to a specified depth exclusive of a defined portion including the contact hole; and second etching part of the metal line etched corresponding to the photo-diode.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 3 is a cross-sectional view of a solid state image sensor fabricated according to present invention.

DETAILED DESCRIPTION OF PREFERRED EMBODIMENT

Reference will now be made in detail to the preferred embodiments of the present invention, examples of which are illustrated in the accompanying drawings.

Figure 1:
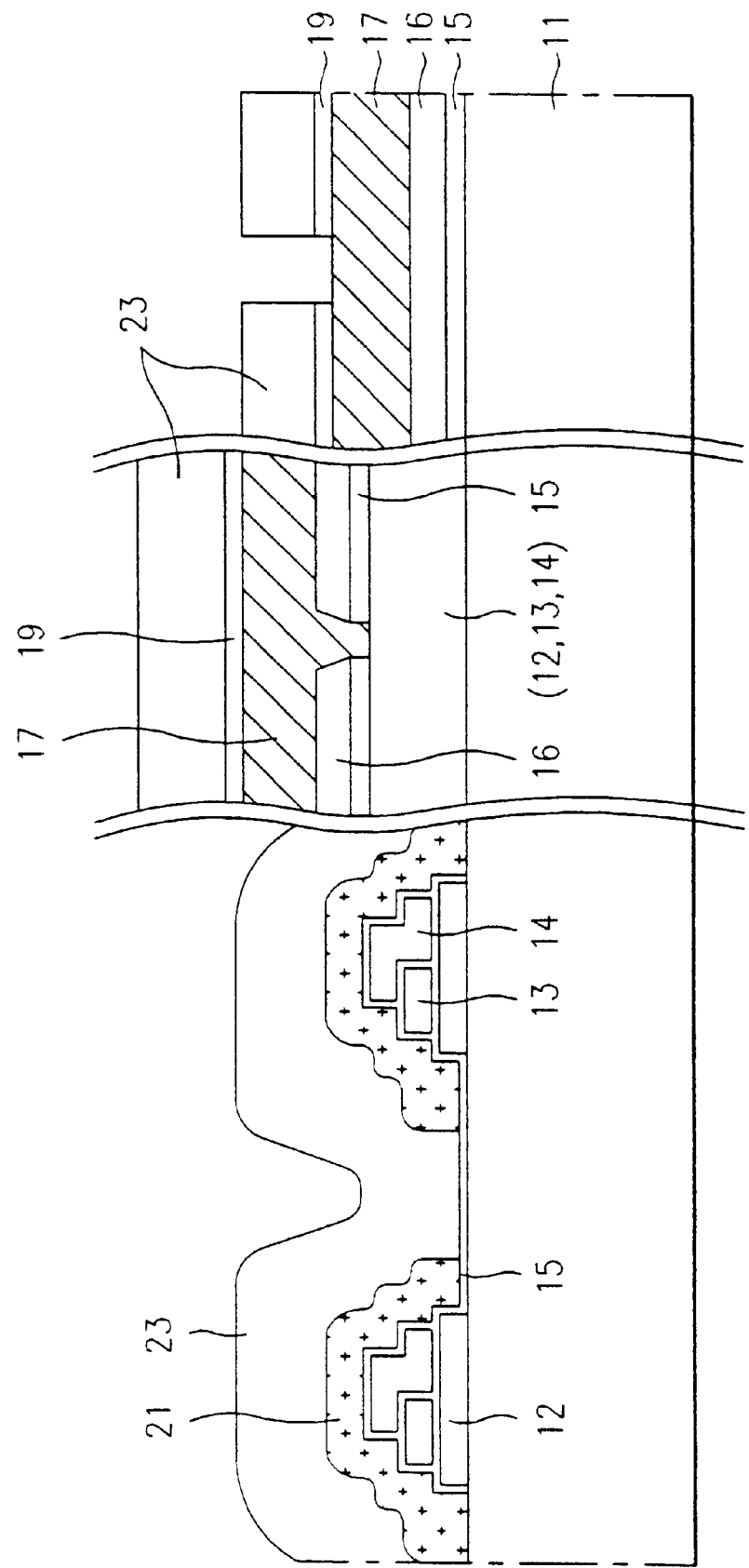
FIG. 1 is a cross-sectional view of a solid state image sensor fabricated according to prior art.
Figure 2A:
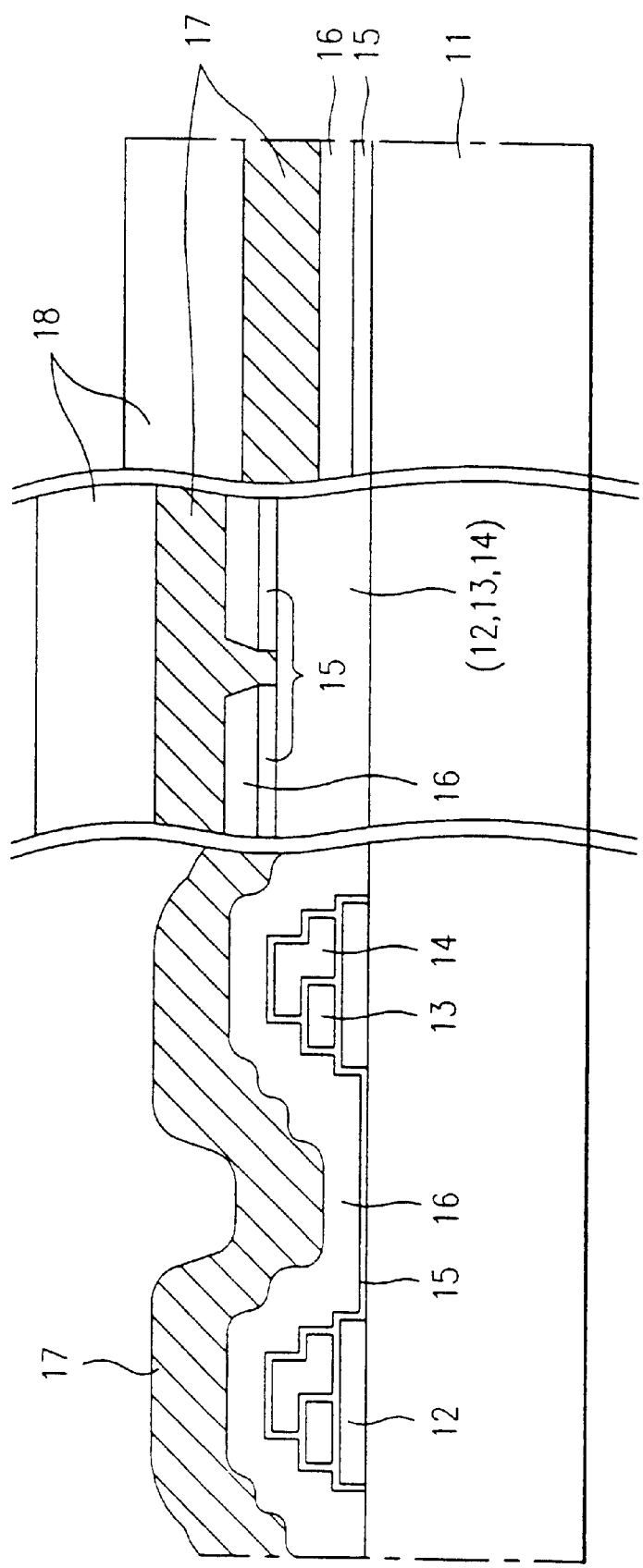
FIGS. 2a–2e are cross-sectional views illustrating a method for fabricating a conventional solid state image sensor.
Figure 2B:
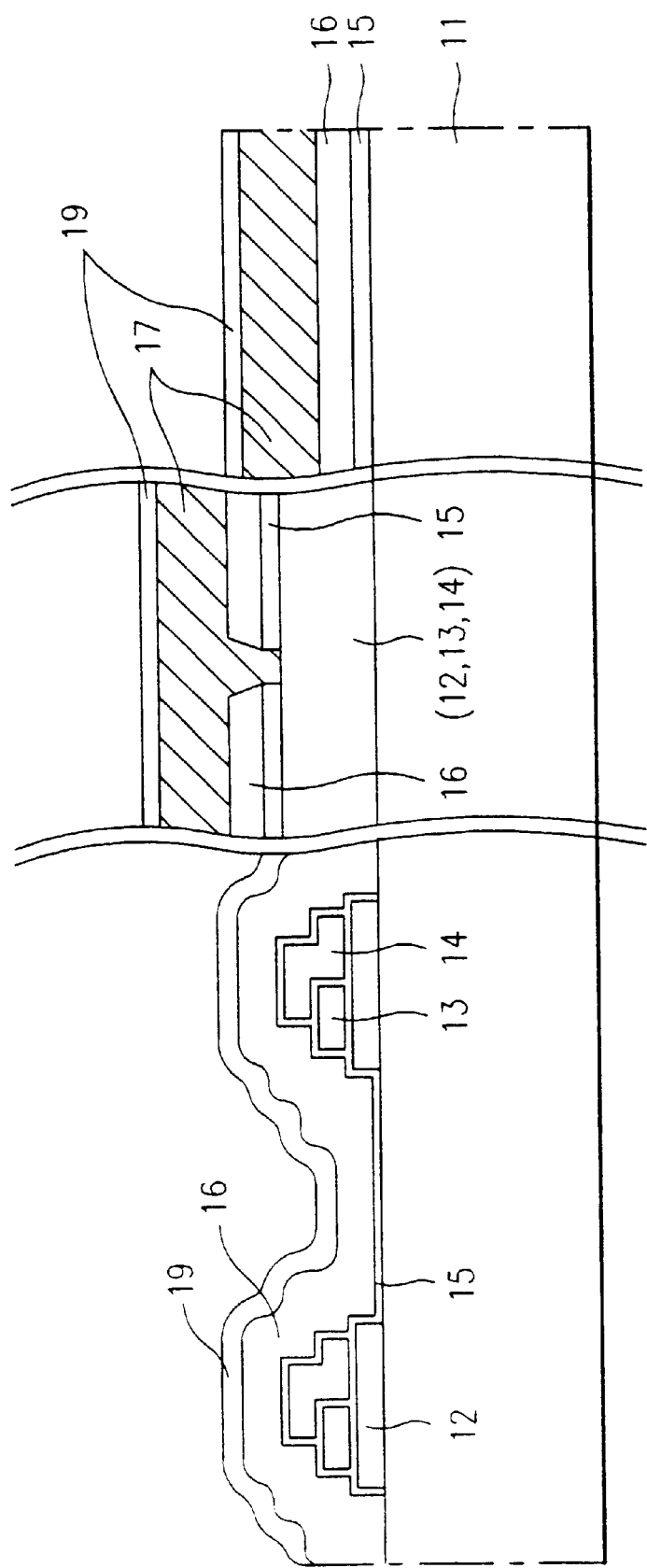
Figure 2C:
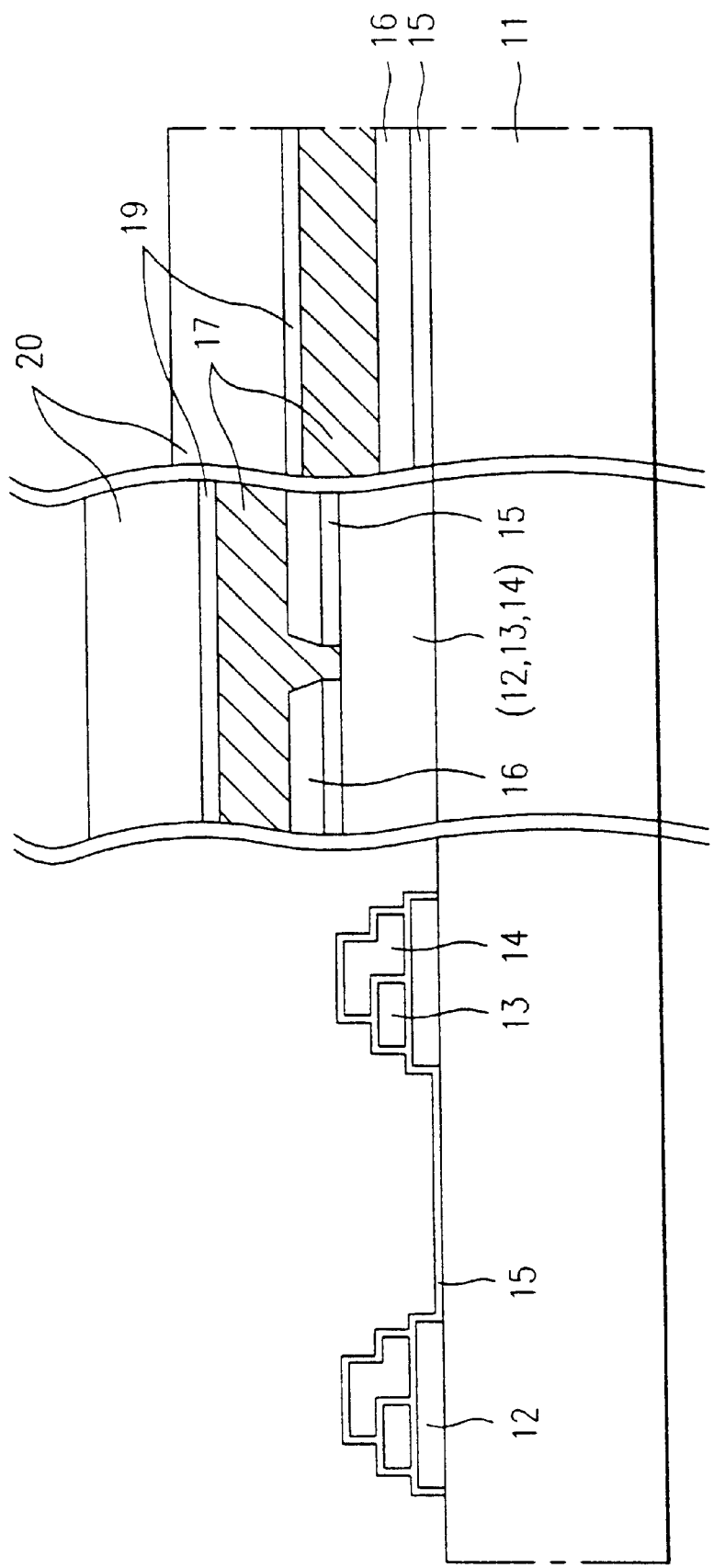
Figure 2D:
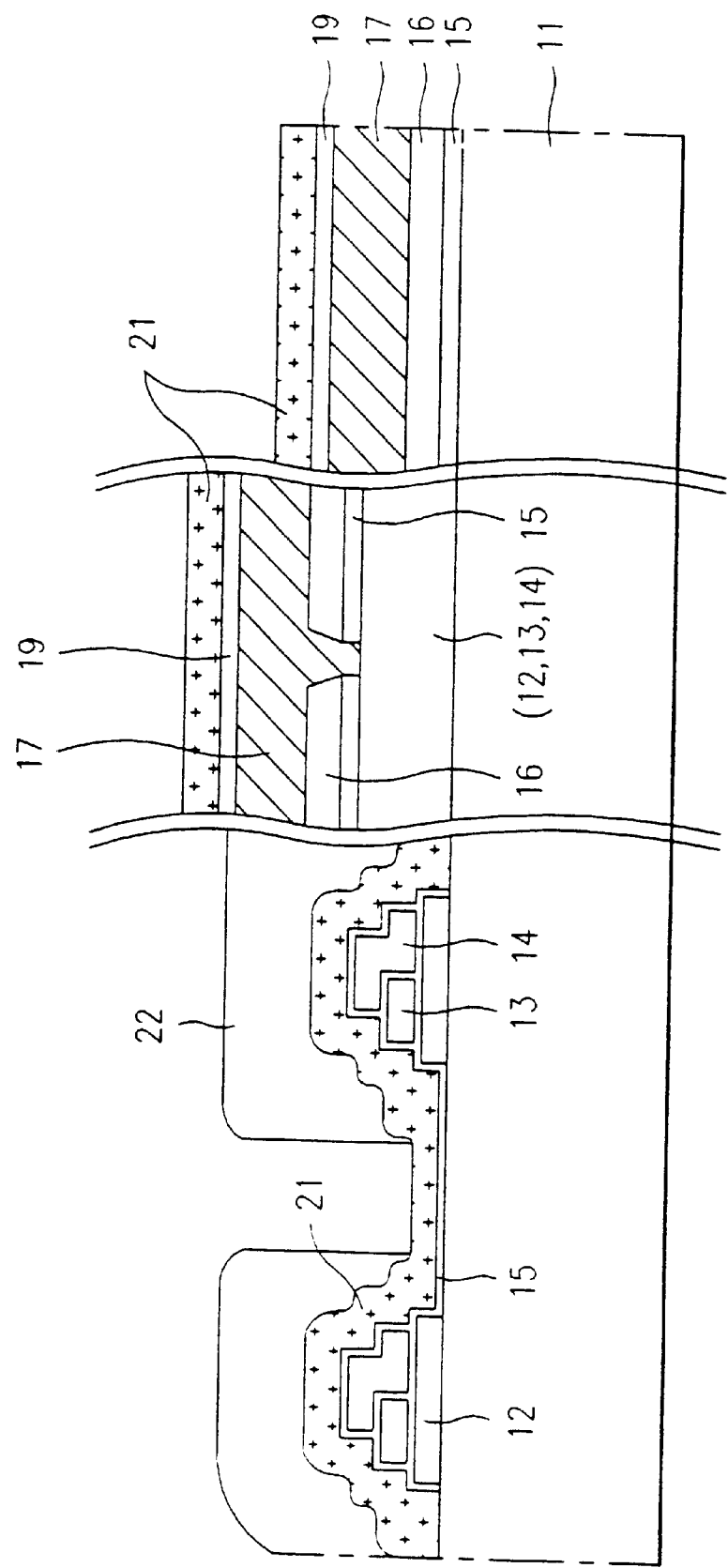
Figure 2E:
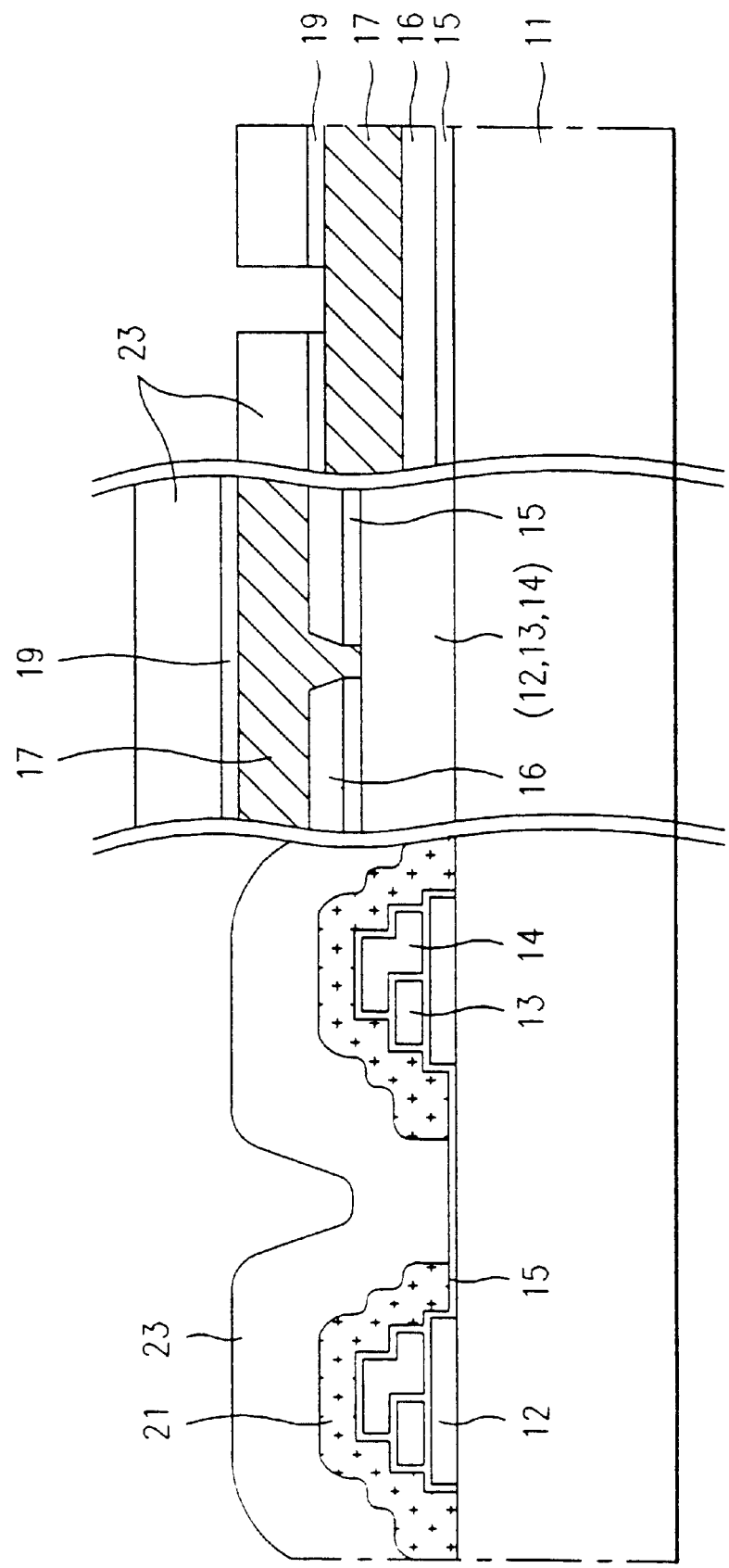
Figure 4A:
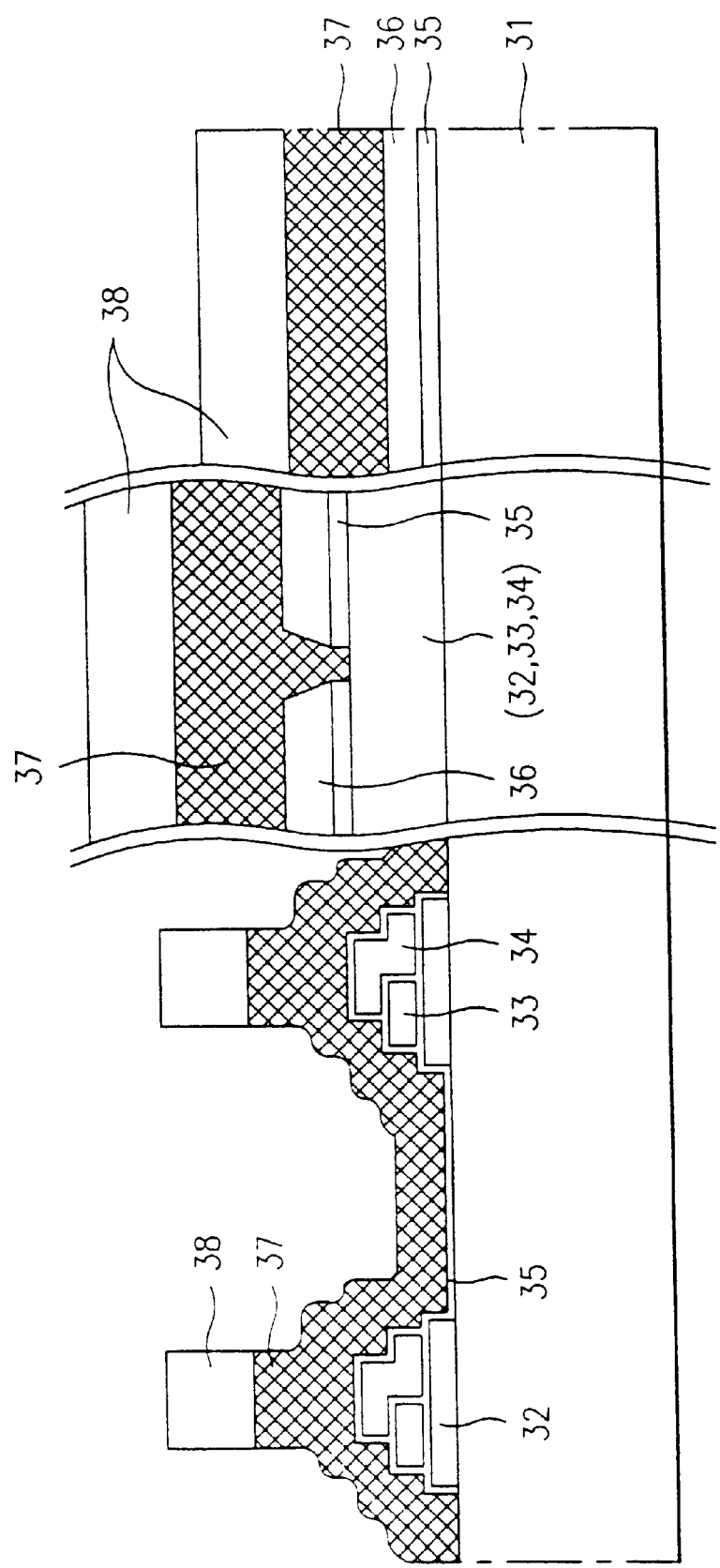
FIGS. 4a–4c are cross-sectional views illustrating a method for fabricating a solid state image sensor in accordance with the present invention.
Figure 4B:
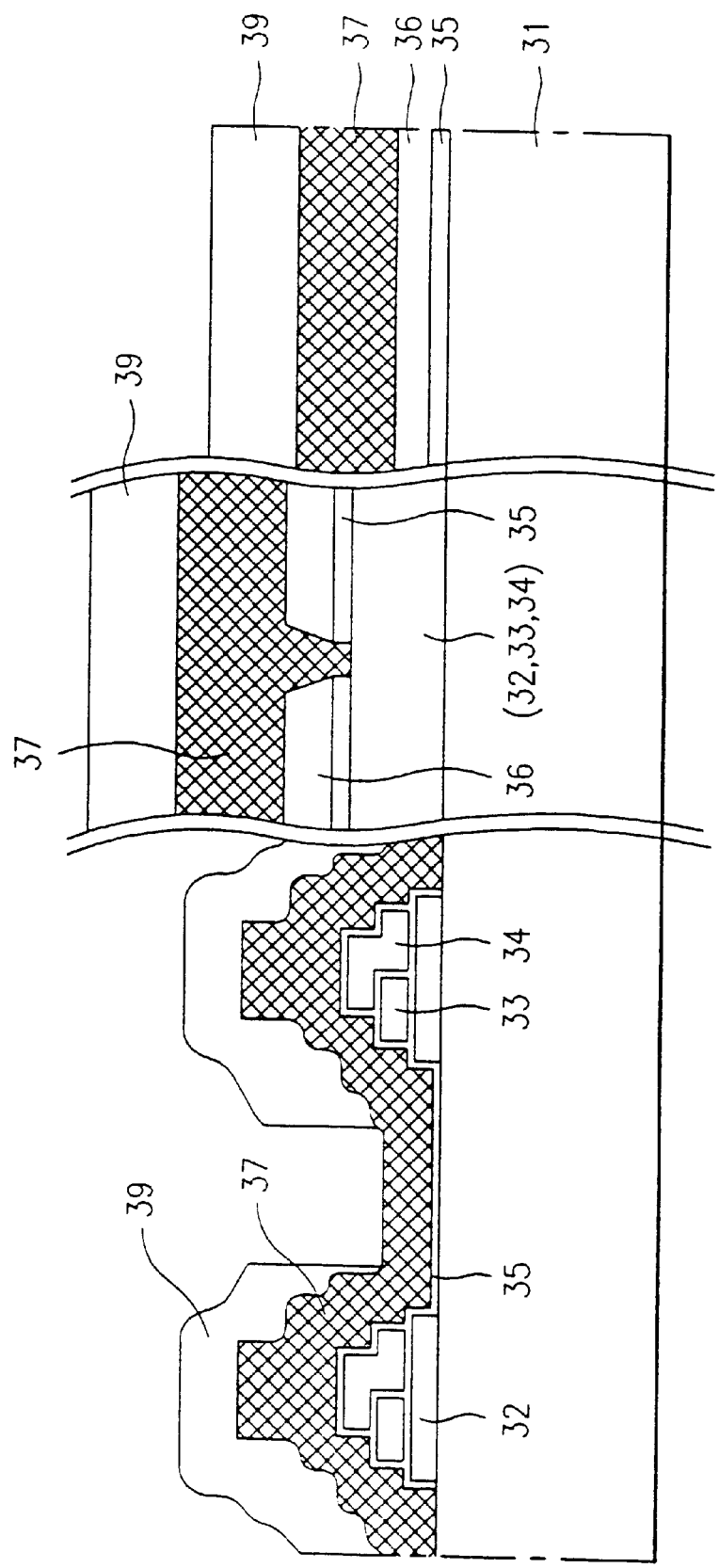
Figure 4C:
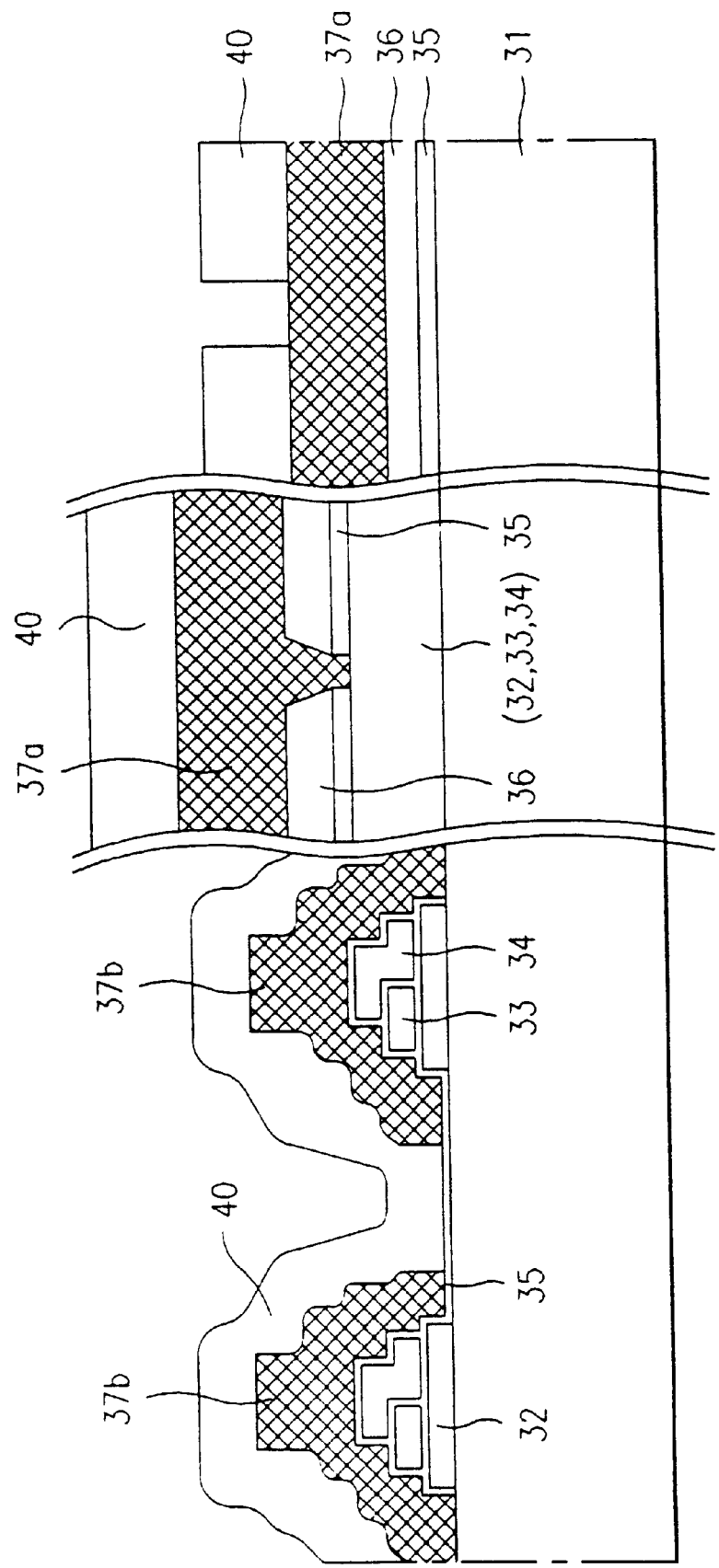

FIG. 3 is a cross-sectional view of a solid state image sensor fabricated according to present invention, and FIGS. 4a–4c are cross-sectional views illustrating a method for fabricating the solid state image sensor in accordance with the present invention, wherein there are shown a pixel region, a contact forming region in a ferry region, and a pad forming region in order from the left side of the figures.

Such a solid state image sensor, as shown in FIG. 3, has first, second and third transfer gates 32, 33 and 34 between photo-diodes of the pixel region and in the contact forming region of the ferry region.

An HLD (High-temperature and Low-pressure Dielectric) layer 35 is provided to surround the first, second and third transfer gates 32, 33 and 34. There are further formed a light-shielding layer 37b in the region exclusive of the photo-diodes out of the pixel regions. The light-shielding layer 37b is about 10000 Å thick on a defined portion of the first, second and third transfer gates 32, 33 and 34 and about 4000 Å in the rest of the region. And, a passivation layer 40 is formed on the whole surface of the pixel region.

In the contact forming region out of the ferry region, there are formed a contact hole between the HLD layer 35 and smooth protective layer 36, exposing defined portions of the first, second and third transfer gates 32, 33 and 34. A metal line 37a is in contact with the first, second and third transfer gates 32, 33 and 34 through the contact hole. The metal line 37a includes at least one selected from the group consisting of aluminum Al, tungsten silicide, and titanium nitride TiN, and it is deposited to have a thickness of about 10000 Å.

The HLD layer 35, smooth protective layer 36 and metal line 37a are sequentially laminated on a substrate 31 in the pad forming region.

A passivation layer 40 consisting of PSiN is deposited on the metal line 37a in the contact forming region and the pad forming region, and it is pad-open such that a defined portion of the metal line 37a is exposed.

FIGS. 4a–4c are cross-sectional views illustrating a method for fabricating such a solid state image sensor in accordance with the present invention.

As shown in FIG. 4a, a substrate 31 has first, second and third transfer gates 32, 33 and 34 laminated between PDs (Photo-Diodes) and in the ferry region. An HLD layer 35 surrounds the first, second and third transfer gates 32, 33 and 34 in the substrate 31. A nitride layer is deposited on the substrate 31 and part of the nitride layer disposed in the ferry region is eliminated. After deposition of a smooth protective layer 36 on the substrate 31, a photo resist is deposited on the whole surface and selectively patterned through an exposure and a development, etching part of the photo resist in the contact forming region and the pixel region. Using the photo resist patterned as a mask, only the smooth protective layer 36 is eliminated in the pixel region and the smooth protective layer 36 and insulating layer 35 are anisotropically etched in the contact forming region such that defined portions of the first, second and third transfer gates 32, 33 and 34 are exposed. An aluminum film 37 approximately 10000 Å thick is deposited on the whole surface by a sputtering technique, wherein the aluminum film 37 is made from at least one selected from the group consisting of aluminum Al, tungsten silicide, and titanium nitride TiN.

Next, a photo resist 38 is formed on the aluminum film 37 and selectively patterned through an exposure and a development, remaining part of the photo resist 38 only in defined portions on the first, second and third transfer gates 32, 33 and 34 in the light-shielding region out of the pixel regions. The photo resist 38 patterned is used as a mask in a first anisotropic etching, so that the aluminum film 37 becomes about 4000 Å in thickness. Accordingly, the aluminum film 37 having the thickness of 10000 Å is left only on the first, second and third transfer gates 32, 33 and 34. The photo resist 38 is then eliminated.

As shown in FIG. 4b, a photo resist 39 is formed on the substrate 31 and selectively patterned through an exposure and a development such that only the photo resist 39 is etched only in the PD region of the pixel region. The photo resist 39 patterned is used as a mask in a second anisotropic etching, so that the aluminum film 37 on the photo-diode is eliminated. The residual aluminum film 37 in the light-shielding region forms a light-shielding layer 37b which covers horizontal and vertical charge carrying regions HCCD and VCCD. The photo resist 39 is then eliminated.

As shown in FIG. 4c, a passivation layer 40 consisting of PSiN is formed on the whole surface of the substrate 31 and anisotropically etched in the pad forming region out of the ferry region, opening the pad so as to expose a metal line 37a. The metal line 37a and light-shielding layer 37b are simultaneously formed in such a manner that the aluminum film 37 is deposited to be thick enough once and a photo-process is performed.

Such as in the present invention as described above, the solid state image sensor and method for fabricating the same has some advantages as follows.

First, the number of processes in the fabrication can be reduced with a consequence of enhancing the productivity because no insulating layer consisting of PSiO is needed to deposit between aluminum films and also because one time of deposition of the aluminum film makes it possible to form the light-shielding layer in the pixel region and the metal line in the contact forming region and pad forming region of the ferry region in a simultaneous manner.

Second, the aluminum film thickened on the first, second and third transfer gates in the pixel region shields the light perfectly like a light-shielding layer.

Finally, the morphology can be improved in the subsequent process by forming such a thick aluminum film on the first, second and third transfer gates in the pixel region.

It will be apparent to those skilled in the art that various modifications and variations can be made in the solid state image sensor and method for fabricating the same according to the present invention without departing from the spirit or scope of the invention. Thus, it is intended that the present invention cover the modifications and variations of this invention provided they come within the scope of the appended claims and their equivalents.

What is claimed is:

1. A solid state image sensor, which includes photo-diodes formed on a semiconductor substrate, and transfer gates disposed around the photo-diodes to transfer signal charges generated from the photo-diodes, the solid state image sensor comprising:

an insulating layer formed on the whole surface of the semiconductor substrate and having a contact hole exposing a defined portion of the transfer gates;

a singular metal line formed substantially across a pixel region, a ferry region, a pad region, and inside of the contact hole in a single deposition process; and a light-shielding layer formed by the metal line without overlapping upper parts of the photo-diodes.

2. The solid state image sensor as defined in claim 1, wherein the transfer gates comprises a plurality of gates.

3. The solid state image sensor as defined in claim 1, wherein the metal line and the light-shielding layer simultaneously include at least one selected from the group consisting of aluminum Al, tungsten silicide, and titanium nitride TiN.

4. The solid state image sensor as defined in claim 1, wherein the light-shielding layer is laminated in a pixel region and is approximately 10000 Å thick at the center of the transfer gates.

5. The solid state image sensor as defined in claim 1, further comprising a protective layer formed on the metal line and the light-shielding layer.

6. A solid state image sensor including photo-diodes and transfer gates, the photo-diodes are formed by a semiconductor substrate, and the transfer gates are disposed around the photo-diodes to transfer signal charges generated from the photo-diodes, the solid state image sensor comprising:

an insulating layer on the semiconductor substrate, the insulating layer defining a contact hole exposing a portion of the transfer gates; and a singular metal line formed substantially across a pixel region, a ferry region, a pad region, and extending in the contact hole in a single deposition process, and forming a light-shielding layer overlapping upper parts of the photo-diodes.

* * * * *

UNITED STATES PATENT AND TRADEMARK OFFICE
CERTIFICATE OF CORRECTION

PATENT NO. : 6,627,929 B2  Page 1 of 1
APPLICATION NO. : 09/879061
DATED : September 30, 2003
INVENTOR(S) : Jin Seop Shim et al.

It is certified that error appears in the above-identified patent and that said Letters Patent is hereby corrected as shown below:

Column 6, line 35, insert --without-- before "overlapping".

Signed and Sealed this

Seventeenth Day of August, 2010

David J. Kappos
*Director of the United States Patent and Trademark Office*